(12) United States Patent
Arai et al.

(10) Patent No.: US 9,171,773 B2
(45) Date of Patent: Oct. 27, 2015

(54) SEMICONDUCTOR DEVICE

(71) Applicant: Mitsubishi Electric Corporation, Tokyo (JP)

(72) Inventors: Kiyoshi Arai, Tokyo (JP); Osamu Usui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/245,261

(22) Filed: Apr. 4, 2014

(65) Prior Publication Data

US 2015/0008570 A1  Jan. 8, 2015

(30) Foreign Application Priority Data

Jul. 3, 2013  (JP) ................... 2013-139454

(51) Int. Cl.
| | |
|---|---|
| *H01L 23/02* | (2006.01) |
| *H01L 23/367* | (2006.01) |
| *H01L 23/42* | (2006.01) |
| *H01L 23/492* | (2006.01) |
| *H01L 23/373* | (2006.01) |
| *H01L 23/433* | (2006.01) |
| *H01L 23/498* | (2006.01) |
| *H01L 23/24* | (2006.01) |
| *H01L 23/053* | (2006.01) |

(52) U.S. Cl.
CPC ............ *H01L 23/3675* (2013.01); *H01L 23/24* (2013.01); *H01L 23/3735* (2013.01); *H01L 23/42* (2013.01); *H01L 23/4334* (2013.01); *H01L 23/492* (2013.01); *H01L 23/49811* (2013.01); *H01L 23/053* (2013.01); *H01L 2224/48091* (2013.01); *H01L 2224/73265* (2013.01); *H01L 2924/12032* (2013.01); *H01L 2924/1305* (2013.01); *H01L 2924/13055* (2013.01); *H01L 2924/13091* (2013.01)

(58) Field of Classification Search
USPC ......................... 257/678, 690, 693, 703, 706, 257/E23.001–E23.194, 700, 705
See application file for complete search history.

(56) References Cited

U.S. PATENT DOCUMENTS

| | | | |
|---|---|---|---|
| 5,536,972 A | 7/1996 | Kato | |
| 2007/0262387 A1* | 11/2007 | Nonaka et al. | ................. 257/356 |
| 2009/0102040 A1* | 4/2009 | Specht et al. | ................. 257/690 |
| 2010/0127383 A1* | 5/2010 | Oka et al. | ....................... 257/692 |

FOREIGN PATENT DOCUMENTS

| | | |
|---|---|---|
| JP | 07-161925 A | 6/1995 |
| JP | 2000-174180 A | 6/2000 |
| JP | 2008-42074 A | 2/2008 |

* cited by examiner

*Primary Examiner* — Jasmine Clark
(74) *Attorney, Agent, or Firm* — Studebaker & Brackett PC

(57) ABSTRACT

A semiconductor device according to the present invention includes a base plate, an insulating layer provided on an upper surface of the base plate, a metal pattern provided on an upper surface of the insulating layer, a semiconductor element bonded to the metal pattern, and an insulating substrate disposed to be in contact with an upper surface of the semiconductor element. An end of the insulating substrate is located outside the semiconductor element in plan view. The end of the insulating substrate and the metal pattern are directly or indirectly bonded. The semiconductor element includes an electrode on the upper surface. A portion of the insulating substrate, in which the electrode on the upper surface of the semiconductor element overlaps in plan view, is provided with a through-hole.

11 Claims, 4 Drawing Sheets

F I G . 7
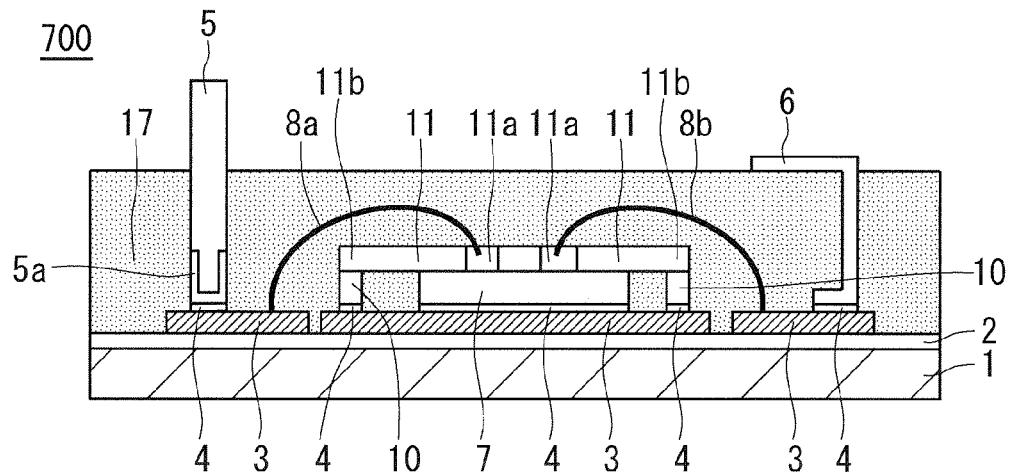
F I G . 8
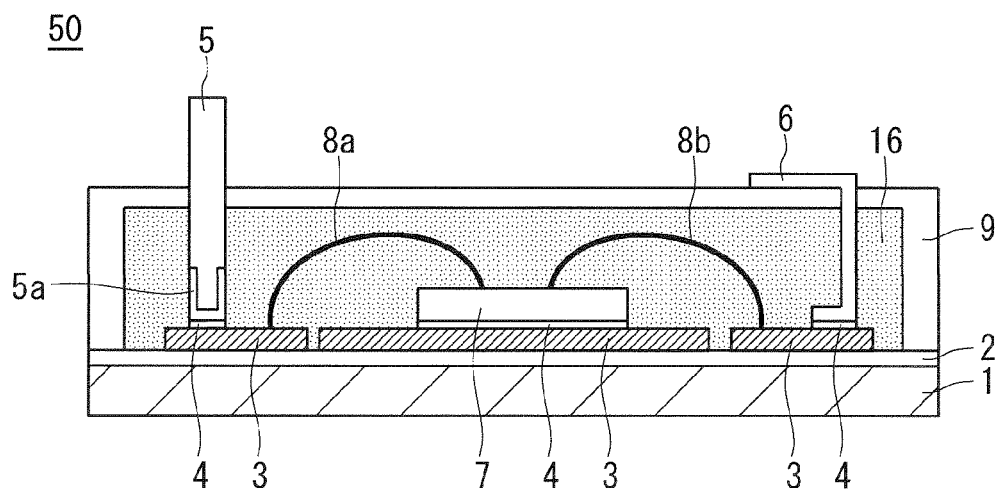

SEMICONDUCTOR DEVICE

BACKGROUND OF THE INVENTION

1. Field of the Invention

The present invention relates to a semiconductor device, and more particularly, to a semiconductor device having a structure which dissipates heat from one side.

2. Description of the Background Art

In recent times, a power electronics for the purpose of saving energy is expected to develop greatly. A power module serving as a semiconductor device packaging a power semiconductor element is adopted as the central part of a power electronics device to greatly contribute to the development.

A power module, which is basically formed of an insulated gate bipolar transistor (IGBT) including a silicon for a base material and a diode, is mainly used in recent days. A power semiconductor element is improved with the times. However, for further development of a power electronics, it is required to be able to control a larger amount of current with reliability. The best method to satisfy the requirement is to change the base material of a power semiconductor element from silicon to silicon carbide (SiC). SiC is desired to be applied to a power module because the material itself has a high insulation breakdown voltage, SiC is able to operate in a high temperature of 300° C. without a thermal runaway, and SiC has approximately one-tenth power loss of silicon during operation comparing in the same current density.

A general power module on a back side exposes a base plate formed of a highly heat conductive material such as copper. The base plate is mechanically joined to a heat dissipation fin by a fastening member such as a screw. The heat dissipation fin is made of aluminum, copper, and the like. In addition, a heat dissipation grease is applied between the base plate and the heat dissipation fin to decrease thermal contact resistance.

When the power module is operated, heat is generated as a loss (product of current and voltage) of the power semiconductor element. This heat is dissipated to the outside by the heat dissipation fin through the base plate. In this manner, in the structure which dissipates heat from the back side of the power module, it is important to efficiently conduct the heat generated in the power semiconductor element to the base plate.

The power module basically has an insulating structure, thereby usually having an insulating layer (insulating substrate and insulating sheet) on an upper part of the base plate. In general, an insulating layer has a great thermal resistance, thereby deteriorating heat dissipation in this portion. To solve this problem, heat conductivity of the insulating layer itself has been increased, the thickness thereof has been reduced, and the like.

For example, in Japanese Patent Application Laid-Open No. 2000-174180, a heat dissipation plate is provided on both of the lower side and the upper side of the semiconductor element to efficiently dissipate heat.

However, increasing heat conductivity of an insulating substrate itself makes the material itself quite expensive, resulting in a cost increase. Moreover, reducing the thickness of the insulating substrate decreases an allowable strength of the insulating substrate, resulting in a fracture in the insulating substrate and a shortage of the insulation breakdown voltage.

SUMMARY OF THE INVENTION

It is an object of the present invention to provide a semiconductor device having enhanced heat dissipation properties without sacrificing costs and an insulation breakdown voltage.

A semiconductor device includes a base plate, an insulating layer provided on an upper surface of the base plate, and a metal pattern provided on an upper surface of the insulating layer. The semiconductor device further includes a semiconductor element bonded to the metal pattern and an insulating substrate disposed to be in contact with an upper surface of the semiconductor element. In the semiconductor device, an end of the insulating substrate is located outside the semiconductor element in plan view, and the end of the insulating substrate and the metal pattern are directly or indirectly bonded. The semiconductor element includes an electrode on the upper surface of the semiconductor element, and a portion of the insulating substrate, in which the electrode on the upper surface of the semiconductor element overlaps in plan view, is provided with a through-hole.

According to the semiconductor device of the present invention, in addition to heat dissipation from a lower surface of the semiconductor element, heat can be dissipated from an upper surface of the semiconductor element through the insulating substrate and the metal pattern bonded to the insulating substrate. In this manner, the heat generated by operating the semiconductor element can be conducted by heat conductivity from both of the lower surface and the upper surface of the semiconductor element to the base plate. In other words, in the conventional method for dissipating heat by a heat dissipation fin in contact with the base plate, the heat can be dissipated more efficiently without sacrificing insulation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a cross sectional view of the semiconductor device according to a sixth preferred embodiment; and FIG. 8 is a cross sectional view of the semiconductor device according to a prerequisite technology.

DESCRIPTION OF THE PREFERRED EMBODIMENTS

Prerequisite Technology

Figure 1:
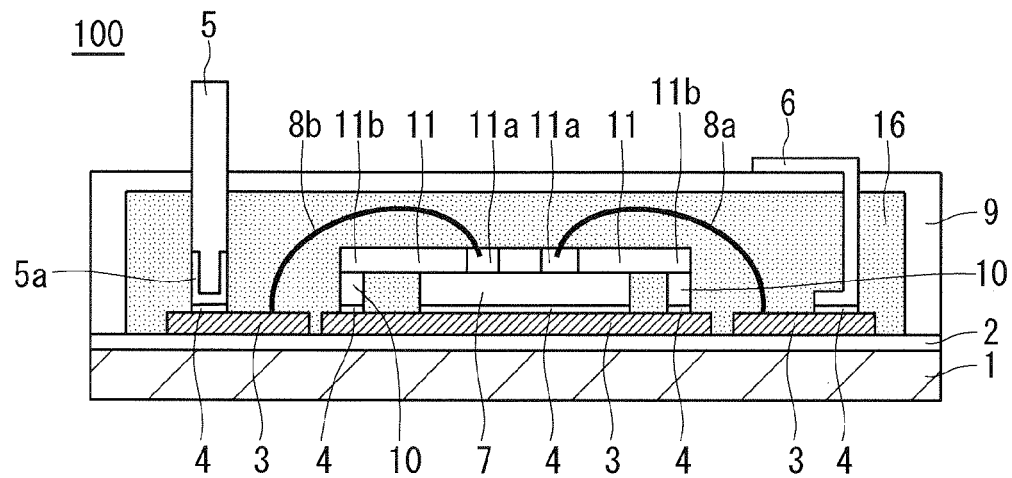
FIG. 1 is a cross sectional view of a semiconductor device according to a first preferred embodiment.

Prior to explaining preferred embodiments of the present invention, a prerequisite technology of the present invention will be described. FIG. 8 shows a cross sectional view of a semiconductor device 50 according to the underlying technology. The semiconductor device 50 includes a base plate 1, an insulating layer 2 provided on an upper surface of the base plate 1, a metal pattern 3 provided on an upper surface of the insulating layer 2. The semiconductor device 50 further includes a semiconductor element 7 bonded onto the metal pattern 3 through a solder 4, a main electrode terminal 5 bonded onto the metal pattern 3 through the solder 4, and a signal terminal 6. An electrode provided on an upper surface of the semiconductor element 7 and the metal pattern 3 are connected by metal wires 8a and 8b.

Moreover, the semiconductor device 50 further includes a case 9 as a case for the semiconductor device 50. As shown in FIG. 8, the case 9 is fixed to the insulating layer 2 without a gap, and it surrounds the metal pattern 3, the semiconductor element 7, the main electrode terminal 5, and the metal wires 8a and 8b. A sealing resin 16, such as a silicon gel and an epoxy resin, fills the inside of the case 9.

When the semiconductor element 7 operates, current and voltage are generated and the product of the current and the voltage causes operation loss. Most of the operation loss is converted into heat. The electrode provided on the upper surface of the semiconductor element 7 is connected to the highly conductive metal wires 8a and 8b made of aluminum, copper, and the like, and current is taken out. The heat generated in the semiconductor element 7 is dissipated from a lower surface of the semiconductor element 7 to the base plate 1 through the metal pattern 3 and the insulating layer 2 that are bonded to the semiconductor element 7. The base plate 1 is in contact with a heat dissipation fin which is not shown, and the heat of the semiconductor element 7 is eventually dissipated from the heat dissipation fin. However, as mentioned above, heat dissipation properties of the insulating layer 2 cause problems.

First Preferred Embodiment

Configuration

FIG. 1 shows a cross sectional view of a semiconductor device 100 according to the present preferred embodiment. The semiconductor device 100 includes a base plate 1, an insulating layer 2 provided on an upper surface of the base plate 1, and a metal pattern 3 provided on an upper surface of the insulating layer 2. The insulating layer 2 is an insulating substrate or an insulating sheet. The metal pattern 3 is made of a high conductive material, such as aluminum and copper. A surface of the metal pattern 3 may be subject to a surface processing (for example, Ni plating and Au plating) ideal for soldering, Ag bonding, and the like.

The semiconductor device 100 further includes a semiconductor element 7 bonded to the metal pattern 3 by a solder 4 or Ag bonding, and an insulating substrate 11 disposed to be in contact with an upper surface of the semiconductor element 7. The semiconductor element 7 is, for example, an IGBT power semiconductor element. The insulating substrate 11 is made of an insulating material having high heat conductivity, such as aluminum nitride (AlN).

The semiconductor device 100 further includes a metal frame 10 provided on an upper surface of the metal pattern 3, and the metal frame 10 is disposed so as to surround the semiconductor element 7 in plan view. The metal frame 10 is made of a highly heat conductive material such as copper, and it is bonded the upper surface of the metal pattern 3 through the solder 4 or Ag bonding. Moreover, the metal frame 10 may be subjected to a surface processing (for example, Ni plating and Au plating) ideal for soldering, Ag bonding, and the like.

An end 11b of the insulating substrate 11 is located outside the semiconductor element 7 in plan view, and the end 11b of the insulating substrate 11 and the metal pattern 3 are indirectly bonded through the metal frame 10. The end 11b of the insulating substrate 11 may be subjected to a surface processing (for example, Ni plating and Au plating) ideal for soldering, Ag bonding, and the like.

The semiconductor element 7 includes an electrode (for example, a main electrode and a control electrode) on the upper surface. A portion of the insulating substrate 11, in which the electrode on the upper surface of the semiconductor element 7 overlaps in plan view, is provided with a through-hole 11a. As shown in FIG. 1, through this through-hole 11a, the electrode on the upper surface of the semiconductor element 7 and the metal pattern 3 are connected by metal wires 8a and 8b. In other words, the metal pattern 3 bonded by a main electrode terminal 5 and a main electrode on the upper surface of the semiconductor element 7 are connected by the metal wire 8a. The main electrode is connected to the metal pattern 3 through a relay terminal 5a.

The metal pattern 3 bonded by a signal terminal 6 and a control electrode on the upper surface of the semiconductor element 7 are connected by the metal wire 8b. The metal wires 8a and 8b are made of a highly conductive metal such as aluminum and copper. Part of the main electrode terminal 5 and the signal terminal 6 are exposed to the outside of the case 9.

A case 9 is fixed to the insulating layer 2 without a gap, and it surrounds the metal pattern 3, the semiconductor element 7, the main electrode terminal 5, the signal terminal 6, and the metal wires 8a and 8b. For example, a silicon gel serving as a sealing resin 16 fills the inside of the case 9.

<Operation>

When the semiconductor element 7 operates, current and voltage are generated and the product of the current and the voltage causes operation loss. Most of the operation loss is converted into heat. The upper surface of the semiconductor element 7 is connected to the highly conductive metal wires 8a and 8b made of aluminum, copper, and the like, and current is taken out from the electrode through the through-hole 11a of the insulating substrate 11. The heat generated in the semiconductor element 7 is dissipated from a lower surface of the semiconductor element 7 to the base plate 1 through the metal pattern 3 and the insulating layer 2 that are bonded to the semiconductor element 7.

On the other hand, the insulating substrate 11 having high heat conductivity such as MN is in contact with the upper surface of the semiconductor element 7, and the heat is also conducted to the insulating substrate 11. Since the end 11b of the insulating substrate 11 bonds an upper surface of the metal frame 10, the heat conducted to the insulating substrate 11 is dissipated from this bonding portion to the base plate 1 through the metal pattern 3 and the insulating layer 2.

The main electrode terminal 5 and the signal terminal 6 incorporate an electrode into the case 9 and it is connected by the highly conductive metal wires 8a and 8b such as aluminum and copper to be exposed to the outside of the case. On the metal pattern 3, a member (for example, the relay terminal 5a) being part of an external electrode such as a highly conductive cylindrical socket made of copper and the like is provided, and, for example, the main electrode terminal 5 and the relay terminal 5a are bonded by press-fit, soldering, or Ag bonding to be exposed to the outside.

In addition, a power semiconductor element including SiC for a base material, such as SiC-MOSFET and SiC-SBD (Schottky barrier diode) can be mounted as the semiconductor element 7. The power semiconductor element including SiC for the base material can operate at higher temperatures compared to a power semiconductor element including Si for a base material due to characteristics of the material.

In the present preferred embodiment (semiconductor device 100), it is also possible to dissipate heat from the upper surface of the semiconductor element 7 to the base plate 1 which is located in the lower part of the module, so that a larger amount of current can pass through compared to the structure in the prerequisite technology (semiconductor device 50). The semiconductor element 7 is made of SiC, which allows for the semiconductor element 7 to be more compact as compared to the case of the semiconductor element 7 made of Si. Therefore, the semiconductor device 100 (power module) can be made more compact.

In general, a semiconductor element adopting SiC for a base material has approximately one-tenth power loss of a semiconductor element using Si for a base material in a temperature of approximately 150° C. which is a normal operating temperature of Si. In other words, the semiconductor element using SiC for the base material has a small power loss, thereby suppressing an increase in temperature of the semiconductor element. In the semiconductor device 100 of the present preferred embodiment, the heat dissipation properties of the semiconductor element 7 are improved, and thus the heat dissipation fin can be made more compact. The miniaturization of the heat dissipation fin allows for the size reduction of a power electronics device such as an inverter. In other words, a power density (W/cm$^3$) is improved.

In the semiconductor device 100 of the present preferred embodiment, there is no addition onto the electric circuit since the insulating substrate 11 is bonded onto the semiconductor element 7. Thus, the addition of the insulating substrate 11 has no effects on electrical properties of the semiconductor device 100 (power module).

In addition, a silicon gel as the sealing resin 16 fills the inside of the case 9, and it may be sealed by a resin potting using an epoxy resin and the like. In a case of sealing with a resin by a transfer mold method, a mold is needed to define an outline, so that it is necessary to prepare a mold for each semiconductor device having a different size (outline). On the other hand, if the resin potting is used as a method for sealing, a mold is not needed by providing the case 9, whereby it is possible to reduce manufacturing costs and to shorten a manufacturing time. The resin potting does not inject a resin at high pressure as in the transfer molding, so that even if adhesion to each structural member is inferior, junctions of each structural member can be bound by the sealing resin 16 after curing. Thus, when heat is generated by operating the semiconductor element 7, a distortion generated by a difference of a thermal expansion coefficient between each structural member can be bound. A thermal stress in a junction can be reduced, and thus the semiconductor device 100 with high reliability can be achieved. Moreover, in a case of adopting SiC for the semiconductor element 7, it is possible to operate at higher temperatures, whereby the thermal stress in a junction can be reduced, which has a greater effect.

<Effects>

The semiconductor device 100 of the present preferred embodiment is characterized as follows. The semiconductor device 100 includes the base plate 1, the insulating layer 2 provided on the upper surface of the base plate 1, the metal pattern 3 provided on the upper surface of the insulating layer 2, the semiconductor element 7 bonded to the metal pattern 3, and the insulating substrate 11 disposed to be in contact with the upper surface of the semiconductor element 7. The end 11b of the insulating substrate 11 is located outside the semiconductor element 7 in plan view. The end 11b of the insulating substrate 11 and the metal pattern 3 are directly or indirectly bonded. The semiconductor element 7 includes the electrode on the upper surface. The portion of the insulating substrate 11, in which the electrode on the upper surface of the semiconductor element 7 overlaps in plan view, is provided with the through-hole 11a.

Therefore, the semiconductor device 100 of the present preferred embodiment can dissipate heat from the upper surface of the semiconductor element 7 through the insulating substrate 11 and the metal pattern 3 bonded to the insulating substrate 11 in addition to the heat dissipation from the lower surface of the semiconductor element 7. In this manner, the heat generated by operating the semiconductor element 7 can be conducted from both of the lower surface and the upper surface of the semiconductor element 7 to the base plate 1. In other words, in the conventional method for dissipating heat by the heat dissipation fin in contact with the base plate 1, heat can be dissipated more efficiently without sacrificing insulation. Thus, an increase in temperature of the semiconductor element 7 can be more suppressed, whereby a larger amount of current can pass through the semiconductor element 7 having the same size as conventionally. In other words, the operation current density (unit is [A/cm$^2$], for example) of the semiconductor element 7 can be increased. Furthermore, in a case of operating by the same operation current as conventionally, the size of the semiconductor element 7 can be reduced more than conventionally. Thus, the whole size of the semiconductor device 100 (power module) can be reduced. Moreover, costs can be lowered.

The semiconductor device 100 of the present preferred embodiment is characterized as follows. The semiconductor device 100 further includes the metal frame 10 provided on the upper surface of the metal pattern 3. The metal frame 10 is provided so as to surround the semiconductor element 7 in plan view. The end 11b of the insulating substrate 11 and the metal pattern 3 are bonded through the metal frame 10.

Therefore, if the metal frame 10 is made of metal having high heat conductivity, the heat of the insulating substrate 11 can be efficiently conducted to the metal pattern 3.

Moreover, the semiconductor device 100 of the present preferred embodiment is characterized as follows. The semiconductor device 100 further includes the case 9 fixed to the upper surface of the insulating layer 2 without a gap to surround the semiconductor element 7 and the insulating substrate 11. The case 9 is filled with the sealing resin 16.

Therefore, the potting can perform the resin sealing step by providing the case 9. The resin sealing by the potting can be achieved more easily than that by the transfer mold method, so that even in a case of manufacturing a small quantity of the semiconductor device 100, manufacturing costs can be suppressed.

Second Preferred Embodiment

Figure 2:
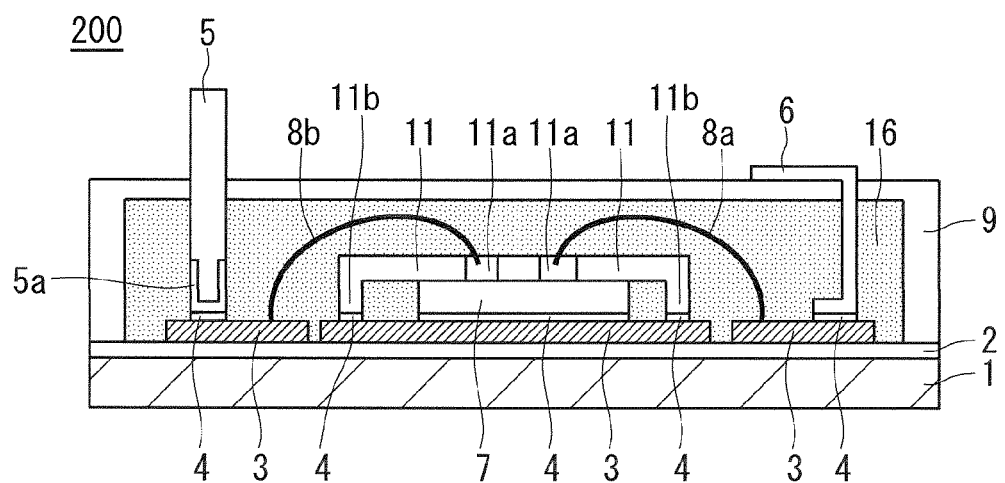
FIG. 2 is a cross sectional view of the semiconductor device according to a second preferred embodiment.

FIG. 2 is a cross sectional view showing a semiconductor device 200 of the present preferred embodiment. The semiconductor device 200 does not include the metal frame 10 unlike the semiconductor device 100 and has a different structure of the insulating substrate 11. In the semiconductor device 200, the end 11b of the insulating substrate 11 extends substantially perpendicular to the metal pattern 3. Furthermore, the end 11b of the insulating substrate 11 and the metal pattern 3 are directly bonded by the solder 4 or Ag bonding. The other structures are the same as that of the semiconductor device 100 (FIG. 1), and the descriptions will be omitted.

<Effects>

The semiconductor device 200 of the present preferred embodiment is characterized as follows. The end 11b of the insulating substrate 11 extends substantially perpendicular to the metal pattern 3. The end 11b of the insulating substrate 11 is directly bonded to the metal pattern 3.

Therefore, in addition to the effects as mentioned in the first preferred embodiment, a path for dissipating heat from the upper surface of the semiconductor element 7 to the metal pattern 3 can be made shorter by the structure in which the insulating substrate 11 is directly connected to the metal pattern. Thus, heat dissipation properties can be improved while a space for dissipating heat can be reduced, which allows for the miniaturization of the semiconductor device 200.

Third Preferred Embodiment

Figure 3:
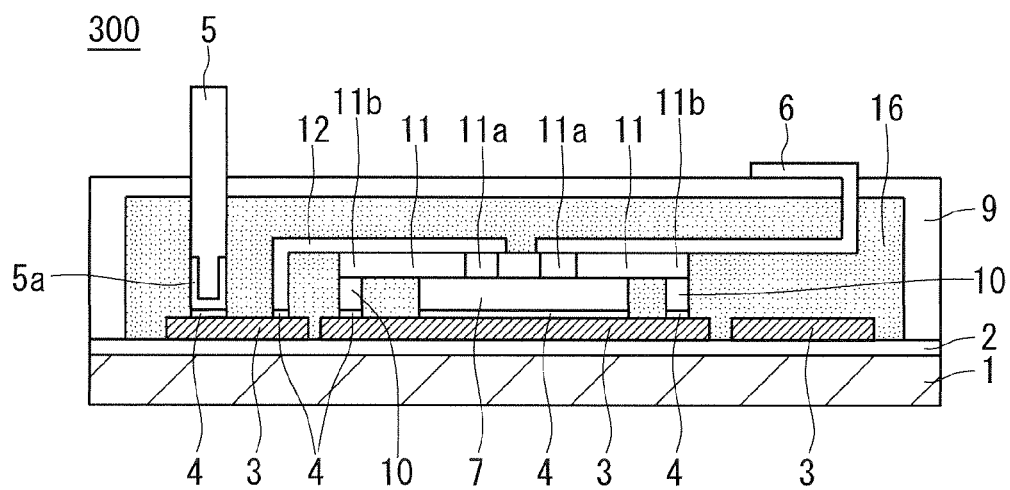
FIG. 3 is a cross sectional view of the semiconductor device according to a third preferred embodiment.

FIG. 3 is a cross sectional view showing a semiconductor device 300 of the present preferred embodiment. In the first preferred embodiment (FIG. 1), the electrode on the upper surface of the semiconductor element 7 and the metal pattern 3 are connected by the metal wires 8a and 8b. On the other hand, in the present preferred embodiment, the main electrode on the upper surface of the semiconductor element 7 and the metal pattern 3 are connected by a metal terminal 12 instead of the metal wire 8a. In addition, in the present preferred embodiment, the control electrode of the upper surface of the semiconductor element 7 is directly connected to the signal terminal 6.

One end of the metal terminal 12 and the main electrode on the upper surface of the semiconductor element 7 are bonded by a solder or Ag filled in the through-hole 11a of the insulating substrate 11. The other end of the metal terminal 12 is bonded to the metal pattern 3 by the solder 4 or Ag bonding. As shown in FIG. 3, in a region in which the metal terminal 12 and the insulating substrate 11 overlap in a plan view, the metal terminal 12 and the upper surface of the insulating substrate 11 are in contact with each other. The metal terminal 12 is made of a high conductive material, such as copper and aluminum. The metal terminal 12 may be subject to a surface processing (for example, Ni plating and Au plating) ideal for soldering, Ag bonding, and the like.

In the first preferred embodiment, the signal terminal 6 is connected to the control electrode on the upper surface of the semiconductor element 7 through the metal pattern 3 and the metal wire 8b. On the other hand, in the present preferred embodiment, the signal terminal 6 is connected to the control electrode on the upper surface of the semiconductor element 7.

One end of the signal terminal 6 and the control electrode on the upper surface of the semiconductor element 7 are bonded by the solder or Ag filled in the through-hole 11a of the insulating substrate. The other end of the signal terminal 6 is exposed to the outside of the case 9. The other structures of the semiconductor device 300 are the same as that of the first preferred embodiment (FIG. 1), and the descriptions will be omitted.

<Operation>

The heat generated in the semiconductor element 7 is dissipated from the lower surface of the semiconductor element 7 to the base plate 1 made of the high conductive material, such as copper, through the metal pattern 3 and the insulating layer 2. On the other hand, the insulating substrate 11 having high heat conductivity such as MN, is in contact with the upper surface of the semiconductor element 7 and the heat is conducted to the insulating substrate 11. Furthermore, in the present preferred embodiment, the metal terminal 12 is in contact with the insulating substrate 11 and the metal terminal 12 is bonded to the metal pattern 3. Thus, the heat of the insulating substrate 11 can be conducted to the base plate 1 more efficiently.

Figure 4:
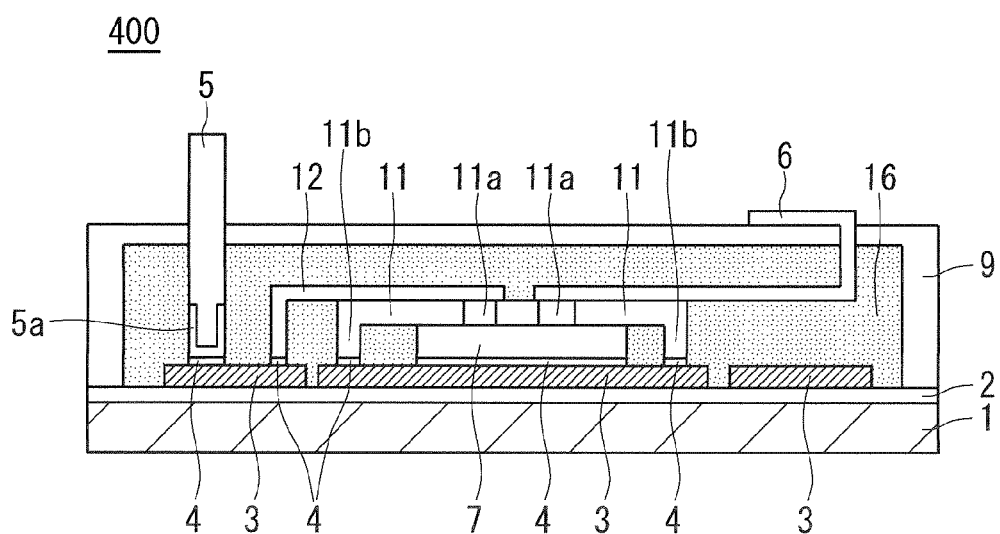
FIG. 4 is a cross sectional view showing another example of the semiconductor device according to a third preferred embodiment.

In the present preferred embodiment, the changes as mentioned above are added to the semiconductor device 100 (FIG. 1) of the first preferred embodiment to obtain the semiconductor device 300, and the same changes may be added to the semiconductor device 200 (FIG. 2) of the second preferred embodiment to obtain a semiconductor device 400 (FIG. 4).

In the semiconductor device 300 of the present preferred embodiment, there is no addition onto the electric circuit since the insulating substrate 11 is bonded onto the semiconductor element 7. Furthermore, even if the metal terminal 12 is disposed on the upper part of the insulating substrate 11, the metal terminal 12 has the same potential as that of the electrode on the upper surface of the semiconductor element 7, thereby forming no capacitor. Thus, the addition of the insulating substrate 11 and the metal terminal 12 has no effects on electrical properties of the semiconductor device 300 (power module).

<Effects>

The semiconductor device 300 of the present preferred embodiment is characterized as follows. The semiconductor device 300 further includes the metal terminal 12. One end of the metal terminal 12 and the electrode on the upper surface of the semiconductor element 7 are electrically bonded through the through-hole 11a. The other end of the metal terminal 12 is bonded to the metal pattern 3. In the region in which the metal terminal 12 and the insulating substrate 11 overlap in a plan view, the metal terminal 12 and the upper surface of the insulating substrate 11 are in contact with each other.

Therefore, the metal terminal 12 is in contact with the upper surface of the insulating substrate 11, and the metal terminal 12 is bonded to the metal pattern 3, whereby the heat conducted from the semiconductor element 7 to the insulating substrate 11 can be conducted to the base 1 more efficiently. In other words, the heat generated in the semiconductor element 7 can be dissipated more efficiently, and thus the reliability of the operation of the semiconductor device 300 is improved. Moreover, the metal terminal 12 makes a connection instead of the metal wire 8a, whereby a larger amount of current can pass through. Particularly, in high temperature operation when the semiconductor element 7 adopting SiC for the base material is mounted, a power cycling lifetime can be improved by making a connection with the metal terminal 12 instead of the metal wire 8a.

Fourth Preferred Embodiment

Configuration

Figure 5:
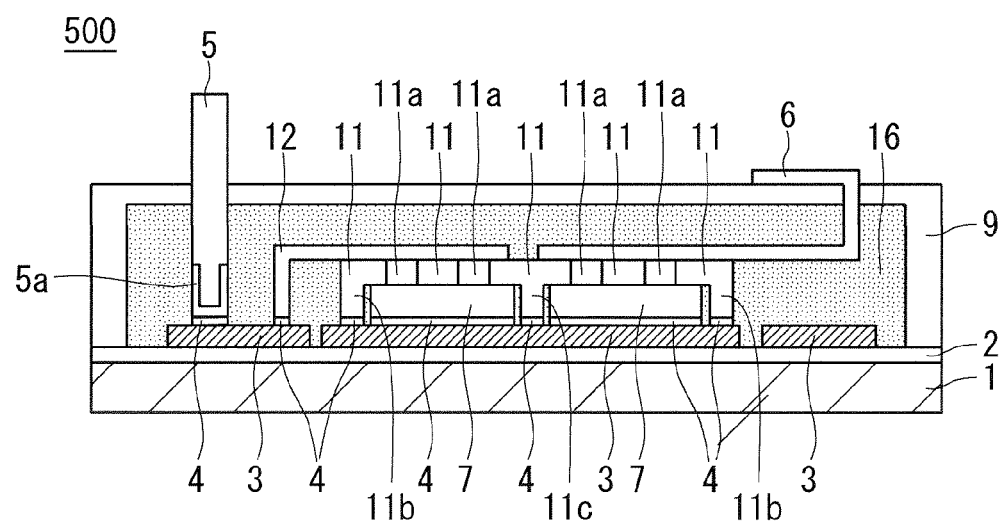
FIG. 5 is a cross sectional view of the semiconductor device according to a fourth preferred embodiment.

FIG. 5 is a cross sectional view showing a semiconductor device 500 of the present preferred embodiment. The semiconductor device 500 of the present preferred embodiment includes a plurality (for example, two) of semiconductor elements 7 in contrast to the semiconductor device 400 (FIG. 4) as described in the third preferred embodiment. The plurality of semiconductor elements 7 form one electric circuit. As described later, the insulating substrate 11 has a grid-like structure suitable for these semiconductor elements 7.

In the insulating substrate 11 similarly to the third preferred embodiment, the end 11b extends to the metal pattern 3, and the end 11b and the metal pattern 3 are bonded by the solder 4 or Ag bonding. In a portion between the semiconductor elements 7 adjacent to each other (adjacent portion 11c), the insulating substrate 11 extends substantially perpendicular to the metal pattern 3, and the extending portion is directly bonded to the metal pattern 3 by the solder 4 or Ag bonding. In other words, the insulating substrate 11 forms a grid-like frame surrounding each of the semiconductor elements 7.

In the semiconductor device 500, the upper surface of the semiconductor elements 7 is in contact with the insulating substrate 11. A portion of the insulating substrate 11, in which the electrode on the upper surface of each semiconductor element 7 overlaps in plan view, is provided with the through-hole 11a. The electrode on the upper surface of each semiconductor element 7 and the metal terminal 12 or the signal terminal 6 are connected through the through-hole 11a by soldering or Ag bonding. The other structures of the semiconductor device 500 are the same as that of the semiconductor device 400, and the descriptions will be omitted.

<Operation>

The heat generated in the plurality of semiconductor elements 7 is dissipated from the lower surface of each semiconductor element 7 to the base plate 1 through the metal pattern 3 and the insulating layer 2. On the other hand, the insulating substrate 11 is in contact with the upper surface of the semiconductor elements 7, and the heat of the semiconductor elements 7 is also conducted to the insulating substrate 11.

The metal terminal 12 is in contact with the insulating substrate 11, and the insulating substrate 11 and the metal pattern 3 are bonded by the solder 4 or Ag bonding. Thus, the heat of the insulating substrate 11 is conducted to the base plate 1 through the metal pattern 3 and the insulating layer 2.

A part of the upper surface of the insulating substrate 11 and the metal terminal 12 are connected through the through-hole 11a by soldering or Ag bonding. Thus, the heat of the insulating substrate 11 is conducted to the metal terminal 12 and conducted to the base plate 1 through the metal pattern 3 and the insulating layer 2.

<Effects>

The semiconductor device 500 of the present preferred embodiment is characterized as follows. The semiconductor elements 7 are plural. The insulating substrate 11 is shared among the plurality of semiconductor elements 7. The insulating substrate 11 extends substantially perpendicular to the metal pattern 3 in the portion between the semiconductor elements 7 adjacent to each other (adjacent portion 11c). The extending portion is directly bonded to the metal pattern 3.

Therefore, the plurality of semiconductor elements 7 are surrounded by the grid-like frame of the common insulating substrate 11, whereby the heat of each semiconductor element 7 can be dissipated uniformly through the grid-like frame.

Fifth Preferred Embodiment

Figure 6:
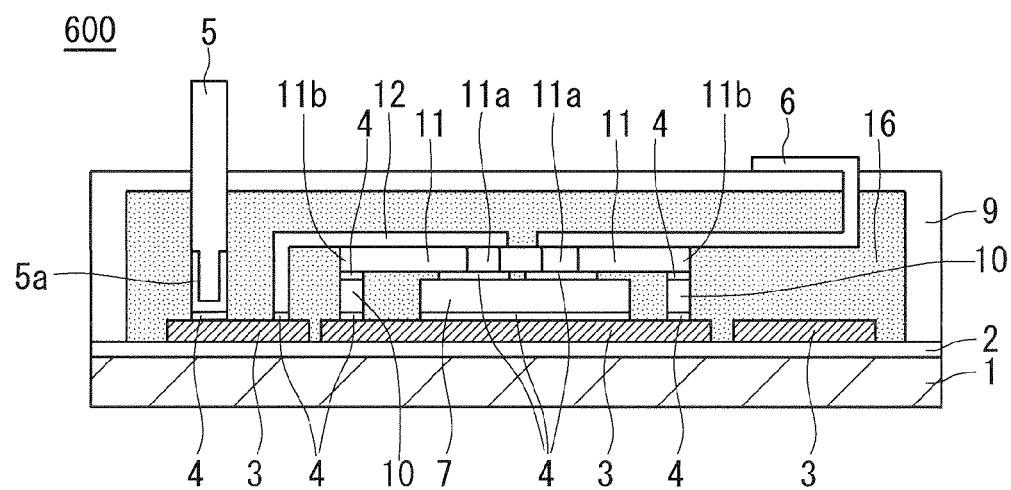
FIG. 6 is a cross sectional view of the semiconductor device according to a fifth preferred embodiment.

FIG. 6 is a cross sectional view showing a semiconductor device 600 of the present preferred embodiment. In the semiconductor device 600, the electrode (for example, an emitter electrode, a gate electrode, and the like in a case of an IGBT) formed on the upper surface of the semiconductor elements 7 and the insulating substrate 11 are bonded by the solder 4 or Ag bonding.

In the semiconductor device 600, the end 11b of the insulating substrate 11 and the upper surface of the metal frame 10 are bonded by the solder 4 or Ag bonding. The other structures are the same as that of the semiconductor device 300 (FIG. 3) of the third preferred embodiment, and the descriptions will be omitted.

The electrode on the upper surface of the semiconductor element 7 and the insulating substrate 11 are bonded by the solder 4 or Ag bonding, so that compared to the case where they are simply in contact with each other, the heat can be conducted more efficiently from the semiconductor elements 7 to the insulating substrate 11. The metal frame 10 and the end 11b of the insulating substrate 11 are bonded by the solder 4 or Ag bonding, so that compared to the case where they are simply in contact with each other, the heat can be conducted more efficiently from the insulating substrate 11 to the metal frame 10.

In the semiconductor devices 100, 200, 400, and 500, the electrode on the upper surface of the semiconductor element 7 and the insulating substrate 11 are bonded by the solder 4 or Ag bonding, so that the effects as mentioned above can be obtained. In the semiconductor device 100, the metal frame 10 and the end 11b of the insulating substrate 11 are bonded by the solder 4 or Ag bonding, so that the effects as mentioned above can be obtained.

<Effects>

The semiconductor device 600 of the present preferred embodiment is characterized in that the electrode on the upper surface of the semiconductor elements 7 and the insulating substrate 11 are bonded by the solder 4 or Ag bonding.

Therefore, the upper surface of the semiconductor elements 7 and the insulating substrate 11 are bonded by the solder 4 or Ag bonding, so that the heat is conducted more efficiently from the semiconductor elements 7 to the insulating substrate 11, thereby increasing the heat dissipation properties of the upper part of the semiconductor elements 7.

Moreover, the semiconductor device 600 of the present preferred embodiment is characterized in that the end 11b of the insulating substrate 11 and the metal frame 10 are bonded by the solder 4 or Ag bonding.

Therefore, the end 11b of the insulating substrate 11 and the metal frame 10 are bonded by the solder 4 or Ag bonding, so that the heat is conducted more efficiently from the insulating substrate 11 to the metal frame 10, thereby increasing the heat dissipation properties of the upper part of the semiconductor elements 7.

Sixth Preferred Embodiment

FIG. 7 is a cross sectional view showing a semiconductor device 700 of the present preferred embodiment. The semiconductor device 700 is characterized in that a structural part serving as a principal part of the semiconductor device 700 (the upper surface of the insulating layer 2, the metal pattern 3, the semiconductor element 7, the insulating substrate 11, and the metal wires 8a and 8b) is sealed with a sealing resin 17 by the transfer mold method.

In a case of sealing with a resin by the transfer mold method, a mold defines an outline, and thus a case for maintaining a sealing material inside is basically not required. In a process of the transfer mold method, the sealing resin 17 is injected into the mold at high pressure, so that the sealing resin 17 is adhered to each structural member with reliability. Thus, at the time of curing the sealing resin 17, the sealing resin 17 can bind around the junctions of each structural member.

Therefore, when the heat is generated by operating the semiconductor element 7, a distortion generated by a difference of a thermal expansion coefficient between each structural member can be bound. A thermal stress in a junction can be reduced, and thus the semiconductor device 700 with high reliability can be achieved. Moreover, in a case of adopting SiC for the semiconductor element 7, it is possible to operate at higher temperatures, whereby the thermal stress in a junction can be reduced, which has a greater effect.

<Effects>

The semiconductor device 700 of the present preferred embodiment is characterized in that the upper surface of the insulating layer 2, the metal pattern 3, the semiconductor element 7, and the insulating substrate 11 are sealed with a resin by the transfer mold method.

Therefore, in a process of the transfer mold method, the sealing resin 17 is injected into the mold at high pressure, so that the sealing resin 17 is adhered to each structural member with reliability. Thus, when heat is generated by operating the semiconductor elements 7, a distortion generated by a difference of a thermal expansion coefficient between each structural member can be bound. A thermal stress in a junction can be reduced, and thus the semiconductor device 700 with high reliability can be achieved.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a base plate;
   an insulating layer provided on an upper surface of said base plate;
   a metal pattern provided on an upper surface of said insulating layer;
   at least one semiconductor element bonded to said metal pattern; and
   an insulating substrate disposed to be in contact with an upper surface of said at least one semiconductor element, wherein
   an end of said insulating substrate is located outside said at least one semiconductor element in plan view,
   said end of said insulating substrate and said metal pattern are bonded,
   said at least one semiconductor element includes an electrode on the upper surface of said at least one semiconductor element, and
   a portion of said insulating substrate, in which said electrode on the upper surface of said at least one semiconductor element overlaps in plan view, is provided with a through-hole.

2. The semiconductor device according to claim 1, further comprising a metal terminal, wherein
   one end of said metal terminal and said electrode on the upper surface of said at least one semiconductor element are electrically bonded through said through-hole,
   the other end of said metal terminal is bonded to said metal pattern, and
   in a region in which said metal terminal and said insulating substrate overlap in plan view, said metal terminal and an upper surface of said insulating substrate are in contact with each other.

3. The semiconductor device according to claim 1, wherein
   said at least one semiconductor element includes a plurality of semiconductor elements,
   said insulating substrate is shared among said plurality of semiconductor elements,
   in a portion between semiconductor elements adjacent to each other, said insulating substrate extends substantially perpendicular to said metal pattern, and
   an extending portion is directly bonded to said metal pattern.

4. The semiconductor device according to claim 1, wherein said electrode on the upper surface of said at least one semiconductor element and said insulating substrate are bonded by soldering or Ag bonding.

5. The semiconductor device according to claim 1, wherein the upper surface of said insulating layer, said metal pattern, said at least one semiconductor element, and said insulating substrate are sealed with a resin by a transfer mold method.

6. The semiconductor device according to claim 1, further comprising a case fixed to the upper surface of said insulating layer without a gap to surround said metal pattern, said at least one semiconductor element, and said insulating substrate, wherein
   said case is filled with a sealing resin.

7. The semiconductor device according to claim 1, wherein said end of said insulating substrate and said metal pattern are directly bonded.

8. The semiconductor device according to claim 1, further comprising an intermediate member, wherein
   said end of said insulating substrate and said metal pattern are bonded through said intermediate member.

9. The semiconductor device according to claim 7, wherein
   said end of said insulating substrate extends substantially perpendicular to said metal pattern, and
   said end of said insulating substrate is directly bonded to said metal pattern.

10. The semiconductor device according to claim 8, wherein
    said intermediate member is a metal frame provided on an upper surface of said metal pattern,
    said metal frame is provided so as to surround said at least one semiconductor element in plan view, and
    said end of said insulating substrate and said metal pattern are bonded through said metal frame.

11. The semiconductor device according to claim 10, wherein said end of said insulating substrate and said metal frame are bonded by soldering or Ag bonding.

* * * * *